(12) United States Patent
Li et al.

(10) Patent No.: US 9,763,346 B2
(45) Date of Patent: Sep. 12, 2017

(54) CURVED DISPLAY DEVICE

(71) Applicant: Shenzhen China Star Optoelectronics Technology Co., Ltd., Shenzhen, Guangdong (CN)

(72) Inventors: Dehua Li, Guangdong (CN); Gang Yu, Guangdong (CN); Shih-hsiang Chen, Guangdong (CN); Yu-chun Hsiao, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 348 days.

(21) Appl. No.: 14/407,940

(22) PCT Filed: Nov. 25, 2014

(86) PCT No.: PCT/CN2014/092129
§ 371 (c)(1),
(2) Date: Dec. 12, 2014

(87) PCT Pub. No.: WO2016/078104
PCT Pub. Date: May 26, 2016

(65) Prior Publication Data
US 2016/0353592 A1 Dec. 1, 2016

(30) Foreign Application Priority Data
Nov. 18, 2014 (CN) .......................... 2014 1 0660054

(51) Int. Cl.
*H05K 5/02* (2006.01)
*H05K 5/00* (2006.01)
*G02F 1/1333* (2006.01)

(52) U.S. Cl.
CPC ..... *H05K 5/0217* (2013.01); *G02F 1/133305* (2013.01); *G02F 1/133308* (2013.01); *H05K 5/0017* (2013.01); *H05K 5/0204* (2013.01); *G02F 2001/133317* (2013.01)

(58) Field of Classification Search
None
See application file for complete search history.

(56) References Cited

U.S. PATENT DOCUMENTS 9,081,540 B1 * 7/2015 Cho .................... G06F 1/1601
9,123,290 B1 * 9/2015 Cho .................... G06F 1/1652
9,360,887 B2 * 6/2016 Lv ...................... G06F 1/1601
(Continued)

FOREIGN PATENT DOCUMENTS

CN 101887660 A 11/2010
CN 103400535 A 11/2013
(Continued)

*Primary Examiner* — Xanthia C Cunningham
(74) *Attorney, Agent, or Firm* — Andrew C. Cheng

(57) ABSTRACT

The present invention discloses a curved display device. The curved display device comprises a frame bracket and a flexible towing component. Wherein, at least two fixed components are arranged on the frame bracket, the flexible towing component is connected between the two fixed components and tows the two fixed components, so that a main surface of the frame bracket assumes a curve Through the above way, the present invention can keep the frame bracket being bended so that the curvature of the curved display device can be kept.

16 Claims, 3 Drawing Sheets

(56) References Cited

U.S. PATENT DOCUMENTS

| | | | |
|---|---|---|---|
| 9,510,440 B2* | 11/2016 | Nam | H05K 1/028 |
| 2011/0249425 A1* | 10/2011 | Aurongzeb | F21V 14/02 |
| | | | 362/102 |
| 2012/0020056 A1 | 1/2012 | Yamagata et al. | |
| 2012/0281367 A1* | 11/2012 | He | H05K 5/02 |
| | | | 361/728 |
| 2013/0265765 A1* | 10/2013 | Liang | G09F 9/3026 |
| | | | 362/249.02 |
| 2013/0329162 A1* | 12/2013 | Fujii | H05K 7/14 |
| | | | 349/58 |
| 2014/0111735 A1 | 4/2014 | Cho et al. | |
| 2014/0198465 A1* | 7/2014 | Park | H05K 5/0226 |
| | | | 361/749 |
| 2014/0226266 A1 | 8/2014 | Kang et al. | |
| 2014/0240906 A1 | 8/2014 | Seo et al. | |
| 2014/0268584 A1 | 9/2014 | Song et al. | |
| 2014/0354938 A1* | 12/2014 | Kim | C03C 15/00 |
| | | | 349/160 |
| 2014/0376163 A1* | 12/2014 | Song | H04N 5/64 |
| | | | 361/679.01 |
| 2015/0009635 A1* | 1/2015 | Kang | G09F 9/301 |
| | | | 361/749 |
| 2015/0043136 A1* | 2/2015 | Kim | G02F 1/133305 |
| | | | 361/679.01 |
| 2015/0130775 A1* | 5/2015 | Kim | G06F 1/1652 |
| | | | 345/205 |
| 2015/0192952 A1* | 7/2015 | Jung | G06F 1/1601 |
| | | | 361/747 |
| 2015/0195932 A1* | 7/2015 | Lee | H05K 5/0217 |
| | | | 361/749 |
| 2015/0346537 A1* | 12/2015 | Yu | G02F 1/133308 |
| | | | 349/60 |
| 2016/0054512 A1* | 2/2016 | Zhou | G02B 6/0068 |
| | | | 362/613 |
| 2016/0192519 A1* | 6/2016 | Song | H05K 5/0217 |
| | | | 361/679.01 |
| 2016/0224056 A1* | 8/2016 | Guo | G09F 9/33 |
| 2016/0295711 A1* | 10/2016 | Ryu | G09F 9/301 |

FOREIGN PATENT DOCUMENTS

| | | | |
|---|---|---|---|
| CN | 103915041 A | 7/2014 | |
| CN | 103941456 A | 7/2014 | |
| CN | 103985322 A | 8/2014 | |
| CN | 104008707 A | 8/2014 | |
| CN | 104008707 U | 8/2014 | |
| CN | 104143296 A | 11/2014 | |
| JP | 10268790 A | 10/1998 | |
| KR | 10-2014-0051846 | * 4/2014 | G09F 9/00 |

* cited by examiner

CURVED DISPLAY DEVICE

BACKGROUND OF THE INVENTION

1. Field of the Invention

The present invention relates to the field of image display, and in particular to a curved display device.

2. The Related Arts

Currently, in the shape design of the display device, the developing trend is mainly focus on ultra thin design and curved design. Ultra thin and curved display is well popular among consumers because of fancy appearance, lightweight structure, and wide viewing angle.

The structure cannot be strengthened by the powerful reinforcing rib due to the limit of the body thickness and the appearance. Therefore, only the manufacturing material can be used to hold the entire display device by means of the strength thereof. However, the cost of high-strength material is high, and the fabrication process thereof is hard; the low-strength material cannot guarantee the strength of display device. Therefore, the curvature of the curved face on display device cannot be guaranteed.

SUMMARY OF THE INVENTION

In order to solve the technical issue, the embodiment according to the present invention provides a curved display device, comprising: a frame bracket, a flexible towing component, and a display panel fixed by the frame bracket; wherein, at least two fixed components are arranged on the frame bracket, the flexible towing component is connected between the two fixed components and tows the two fixed components, so that a main surface of the frame bracket assumes a curve; the display side of the display panel corresponding to the main surface of the frame bracket assumes a curve; and a curvature of the main surface of the frame bracket is changed by adjusting the length of the flexible towing component connected between the adjacent fixed components.

Wherein, the number of the fixed component is plurality, so that the curvature of the main surface can be changed in sections.

Wherein, at least two card slots are arranged on the frame bracket and the fixed component is a stick component arranged individually corresponding to the frame bracket, and the stick components are stuck in the card slot respectively.

Wherein, a wire-hidden slot is connected between the adjacent card slots, and the flexible towing component is arranged in the wire-hidden slot.

Wherein, the fixed components are at least two first hanging components fixed on the frame bracket, and the flexible towing component is fixed on the first hanging component.

Wherein, the curved display device further comprises a second hanging component arranged between the first hanging components, and the flexible towing component is hung on the second hanging component and able to move along the towing direction corresponding to the second hanging component.

Wherein, the methods of the fixed component connecting with the flexible towing component include knotting, welding and screwing.

Wherein, the flexible towing component is a flexible line.

The present invention further provides a curved display device: a frame bracket, a flexible towing component, wherein, at least two fixed components are arranged on the frame bracket, the flexible towing component is connected between the two fixed components and tows the two fixed components, so that a main surface of the frame bracket assumes a curve.

Wherein, the curvature of the main surface is able to be changed by adjusting the length of the flexible towing component connected between the adjacent fixed components.

Wherein, the number of the fixed component is plurality, so that the curvature of the main surface can be changed in sections.

Wherein, the curved display device further comprises a display panel fixed by the frame bracket, and the display side of the display panel corresponding to the main surface of the frame bracket assumes a curve.

Wherein, at least two card slots are arranged on the frame bracket and the fixed component is a stick component arranged individually corresponding to the frame bracket, and the stick components are stuck in the card slot respectively.

Wherein, a wire-hidden slot is connected between the adjacent card slots, and the flexible towing component is arranged in the wire-hidden slot.

Wherein, the fixed components are at least two first hanging components fixed on the frame bracket, and the flexible towing component is fixed on the first hanging component.

Wherein, the curved display device further comprises a second hanging component arranged between the first hanging components, and the flexible towing component is hung on the second hanging component and able to move along the towing direction corresponding to the second hanging component.

Wherein, the methods of the fixed component connecting with the flexible towing component include knotting, welding and screwing.

Wherein, the flexible towing component is a flexible line.

The beneficial effects of the embodiment of the invention are as follows. Distinguishing from the prior art, in the curved display according to the present invention, the flexible towing component is used to tow the fixed component on frame bracket so that the backup force of rebound induced from bending the frame bracket can be cancelled to keep the main surface of the frame bracket being curved and thus the curvature of curved display can be kept.

DETAILED DESCRIPTION OF THE PREFERRED EMBODIMENTS

The accompanying drawings and the following detailed descriptions are the preferred embodiments of the present invention.

Figure 1:
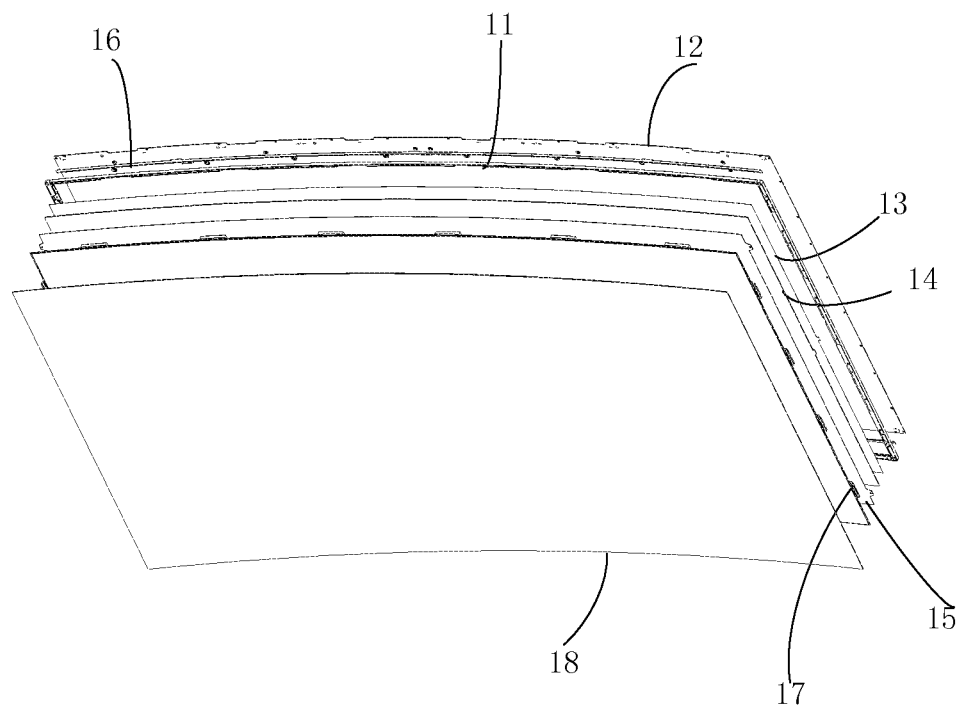
FIG. 1 is a schematic exploded view of the curved display device according to the first embodiment of the present invention.

Referring to FIG. 1, it is a schematic exploded view of the curved display device according to the first embodiment of the present invention. In the present embodiment, the curved display device according to the present invention is described taking liquid crystal display as an example, but for those skilled in the art, the curved display device in present invention can also be OLED display, plasma display or any other type of display. The structure of the liquid crystal display according to the present embodiment is basically the same as the traditional liquid crystal display. Wherein, a frame bracket 11 matches a back panel 12 to form a storage space, and a reflective sheet 13, a light guide plate 14, an optical diaphragm 15 are stacked in turn in the storage space. A light source 16 is arranged at the lateral of the light guide plate 14 to form a backlight module. A display panel 17 is arranged on the optical diaphragm 15 and fixed by the frame bracket 11. The transparent cover plate 18 can play a protective role by further covering the display panel 17.

Figure 2:
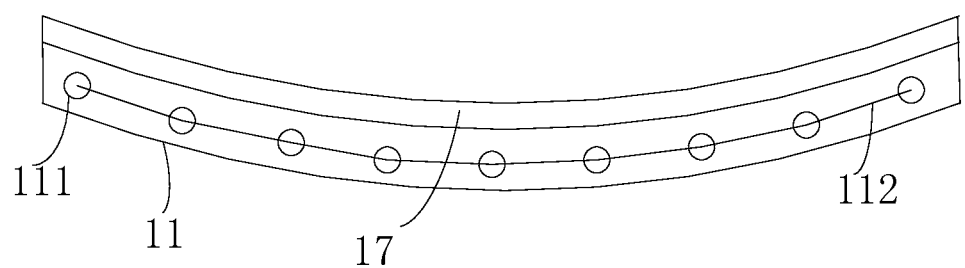
FIG. 2 is a schematic structure of the frame bracket according to the first embodiment of the present invention.

In present embodiment, the main surface of the frame bracket 11 assumes a curve so that the display side of the display panel 17 corresponding to the main surface of the frame bracket assumes a curve, and then the liquid crystal display entirety assume a curve. Referring to FIG. 2, it is a schematic structure of the frame bracket according to the first embodiment of the present invention. In present embodiment, in order to overcome the backup force of rebound induced from bending the frame bracket 11, the frame bracket 11 is still bending after been assembled. The fixed components 111 are arranged on the frame bracket 11, and the structure thereof can be a convex structure on the frame bracket 11 or any other structure, and the number thereof is equivalent to or more than two. The fixed components 111 are preferred to be arranged on the outside of the frame bracket 11 so that the interference induced by the internal device of the frame bracket 11 can be avoided. The adjacent two fixed components 111 are connected with a flexible towing component 112.

The flexible towing component 112 is preferred to adopt the flexible line, specifically, steel wire and nylon rope are chosen. The methods of the fixed component 111 connecting with the flexible towing component 112 include knotting include knotting, welding and screwing. In present embodiment, the flexible towing component 112 tows the fixed component 111 so that the main surface of the frame bracket 11 can assume a curve. Specifically, the length of the flexible towing component 112 connected between the adjacent fixed components 111 is less than the practical length of the frame bracket 11, so that the frame bracket 11 between two fixed components 111 can keep bending to a predetermined curvature, and further the display side of the display panel 17 fixed by the frame bracket 11 corresponding to the main surface of the frame bracket 11 assumes a curve. Of course, the curvature can be designed according to the requirement of liquid crystal display, and the curvature of the main surface of the frame bracket 11 can be changed by adjusting the length of the flexible towing component 112 connected between the adjacent fixed components 111.

Furthermore, in present embodiment, the number of the fixed component 111 is plurality, and therefore the curvature of the main surface of the frame bracket 11 can be changed in sections through the flexible towing component 112 connected between the adjacent fixed components 111.

Distinguishing from the prior art, in the curved display according to the present invention, the flexible towing component is used to tow the fixed component on frame bracket so that the backup force of rebound induced from bending the frame bracket can be cancelled to keep the main surface of the frame bracket being curved and thus the curvature of curved display can be kept.

Figure 3:
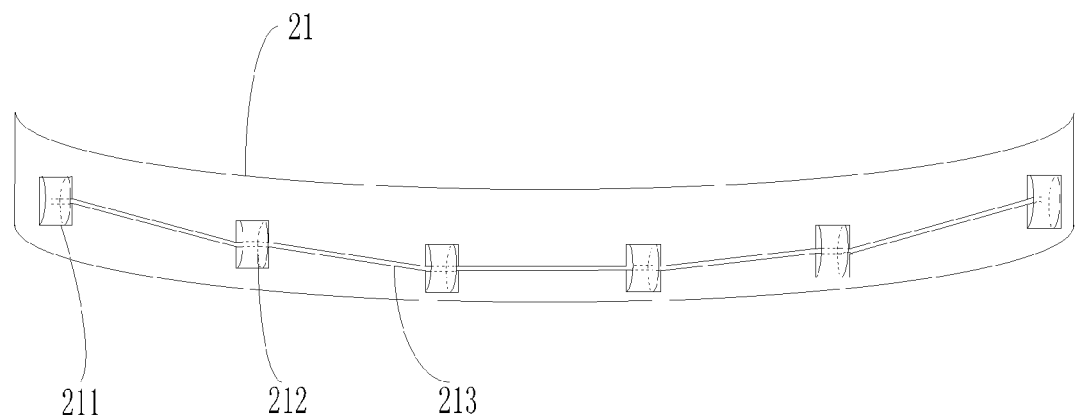
FIG. 3 is a schematic structure of the frame bracket according to the second embodiment of the present invention.
Figure 4:
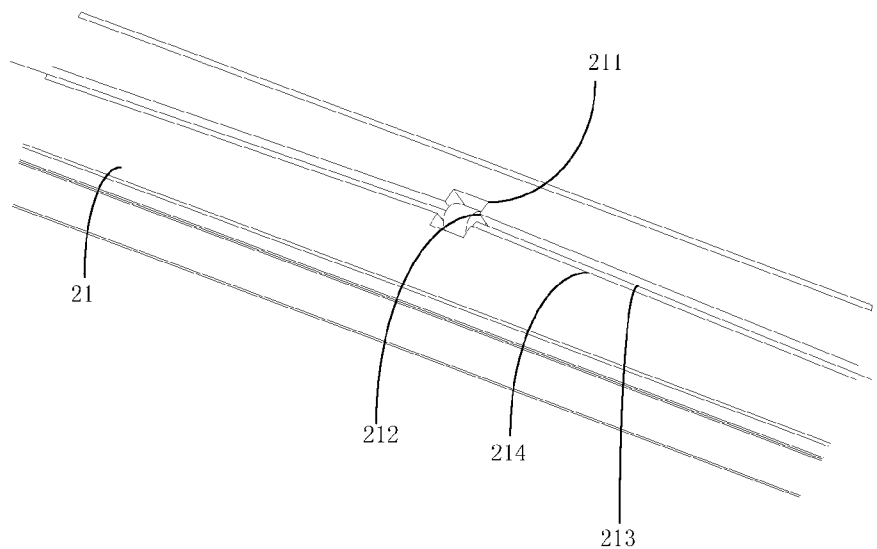
FIG. 4 is a schematic three-dimensional partial view of the frame bracket according to the second embodiment of the present invention.

Referring to FIGS. 3 and 4, FIG. 3 is a schematic structure of the frame bracket according to the second embodiment of the present invention and FIG. 4 is a schematic three-dimensional partial view of the frame bracket according to the second embodiment of the present invention.

In present embodiment, a card slot 211 is arranged on a frame bracket 21, the number of the card slot 211 is at least two, and the card slot 211 is preferred to be arranged at the outside of the frame bracket 21. Meanwhile, the fixed component according to the present embodiment adopt a stick component 212 arranged individually corresponding to the frame bracket 21. In present embodiment, the shape of the stick component 212 corresponds to the card slot 211, which preferred to be cylinder or cubic. The size of the stick component 212 is determined by the size of the card slot 211, so that the stick component 212 can be stuck in the card slot 211. The flexible towing component 213 is connected to the adjacent stick component 212, and the length of the flexible towing component 213 between the adjacent fixed components 212 is less than the practical length of the adjacent card slot 211, so that the frame bracket 21 can assume a curve after the stick component 212 is stuck in the card slot 211 by towing the stick component 212.

In present embodiment, the stick component 212 matches the card slot 211 to avoid the stick component 212 being over jutted out the frame bracket 21 to affect the appearance and interfere with other device.

In present embodiment, the adjacent card slot 211 is connected with a wire-hidden slot 214. Specifically, as show in FIG. 4, and the flexible towing component 213 is arranged in the wire-hidden slot 214 so that the flexible towing component 213 cannot be exposed to affect the appearance and interfere with other device.

Distinguishing from the prior art, the curved display according to the present invention uses the stick component 212 as fixed component and further matches the flexible towing component 213, which can not only keep the frame bracket 21 being curved, but also have the advantages of easily dismantling and no influences on appearance.

Figure 5:
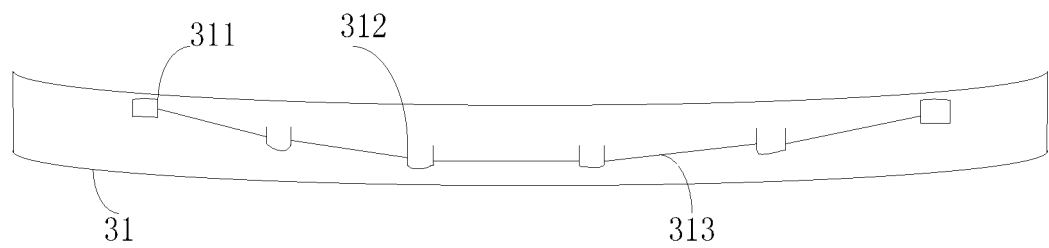
FIG. 5 is a schematic structure of the frame bracket according to the third embodiment of the present invention.
Figure 6:
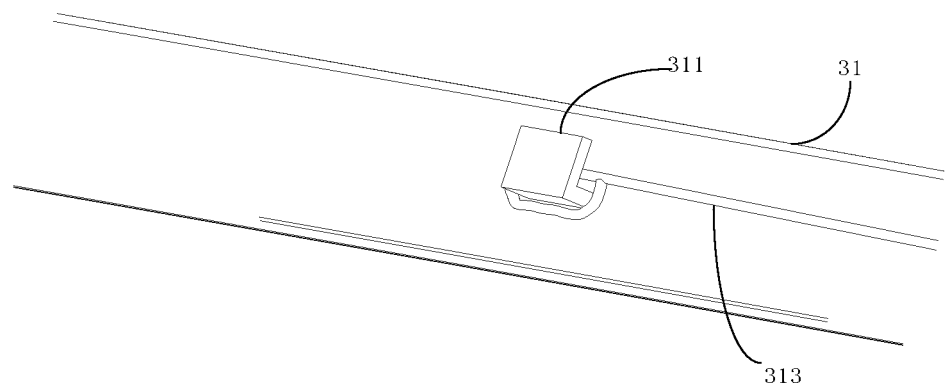
FIG. 6 is a schematic three-dimensional partial view of the frame bracket according to the third embodiment of the present invention.
Figure 7:
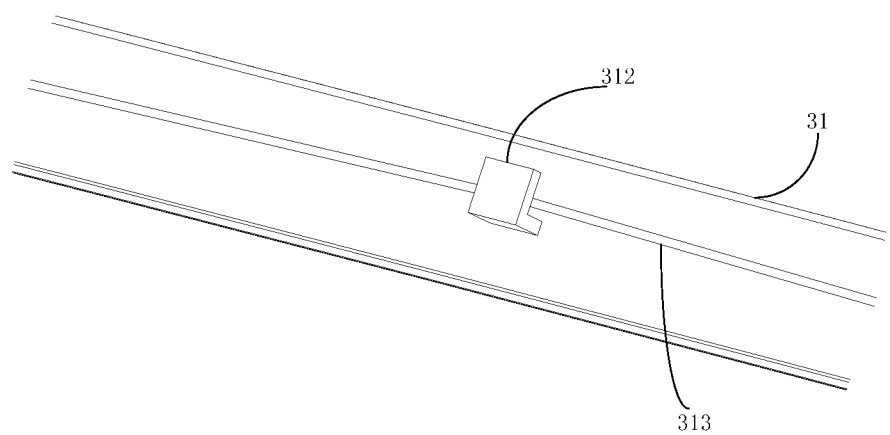
FIG. 7 is another schematic three-dimensional partial view of the frame bracket according to the third embodiment of the present invention.

Referring to FIG. 5-7, FIG. 5 is a schematic structure of the frame bracket according to the third embodiment of the present invention, FIG. 6 is a schematic three-dimensional partial view of the frame bracket according to the third embodiment of the present invention, and FIG. 7 is another schematic three-dimensional partial view of the frame bracket according to the third embodiment of the present invention.

In the present embodiment, two first hanging components 311 and at least one second hanging component 312 arranged between the first hanging components 311 are arranged on a frame bracket 31. The hanging components 311 and the second hanging component 312 assume in a hooked form, which are preferred to be integrated with the frame bracket 31. The flexible towing component 313 is fixed to the two first hanging components 311, and the fixed methods include knotting, welding and screwing. The other locations of the flexible towing component 313 are hung on the second hanging component 312 and can move along the towing direction of the flexible towing component 313 corresponding to the second hanging component 312. The second hanging component 312 is used to keep the flexible towing component 313 on the frame bracket 31, and the length of the flexible towing component 313 is preferred to be less than the sum of the distance between the first hanging component 311 and the second hanging component 312, so that the main surface of the frame bracket 31 can keep the predetermined curvature.

Distinguishing from the prior art, the curved display according to the present invention uses the first hanging component to fix with the flexible towing component, and the second hanging component keep the flexible towing component to over the frame bracket with a hanging method. The fixed method is simplified, which is convenient for integrated dismantling and assembling, when keeping the curvature of the main surface of the frame bracket.

The disclosed embodiments are the preferred embodiments of the present invention, but not intending to impose any unduly constraint to the appended claims. Any equivalent change is considered encompassed in the scope of protection defined by the clams of the present invention.

What is claimed is:

1. A curved display device, comprising: a frame bracket, a flexible towing component, and a display panel fixed by the frame bracket;
   wherein, at least two fixed components are arranged on the frame bracket, the flexible towing component is connected between the two fixed components and tows the two fixed components, so that a main surface of the frame bracket assumes a curve; the display side of the display panel corresponding to the main surface of the frame bracket assumes a curve; and a curvature of the main surface of the frame bracket is changed by adjusting the length of the flexible towing component connected between the adjacent fixed components;
   wherein, at least two card slots are arranged on the frame bracket and the fixed component is a stick component arranged individually corresponding to the frame bracket, and the stick components are stuck in the card slot respectively.

2. The display device as claimed in claim 1, wherein the number of the fixed component is plurality, so that the curvature of the main surface can be changed in sections.

3. The display device as claimed in claim 1, wherein a wire-hidden slot is connected between the adjacent card slots, and the flexible towing component is arranged in the wire-hidden slot.

4. The display device as claimed in claim 1, wherein the fixed components are at least two first hanging components fixed on the frame bracket, and the flexible towing component is fixed on the first hanging component.

5. The display device as claimed in claim 4, wherein the curved display device further comprises a second hanging component arranged between the first hanging components, and the flexible towing component is hung on the second hanging component and able to move along the towing direction corresponding to the second hanging component.

6. The display device as claimed in claim 1, wherein the methods of the fixed component connecting with the flexible towing component include knotting, welding and screwing.

7. The display device as claimed in claim 1, wherein the flexible towing component is a flexible line.

8. A curved display device, comprising: a frame bracket and a flexible towing component, wherein, at least two fixed components are arranged on the frame bracket, the flexible towing component is connected between the two fixed components and tows the two fixed components, so that a main surface of the frame bracket assumes a curve;
   wherein, at least two card slots are arranged on the frame bracket and the fixed component is a stick component arranged individually corresponding to the frame bracket, and the stick components are stuck in the card slot respectively.

9. The display device as claimed in claim 8, wherein the curvature of the main surface is able to be changed by adjusting the length of the flexible towing component connected between the adjacent fixed components.

10. The display device as claimed in claim 8, wherein the number of the fixed component is plurality, so that the curvature of the main surface can be changed in sections.

11. The display device as claimed in claim 8, wherein the curved display device further comprises a display panel fixed by the frame bracket, and the display side of the display panel corresponding to the main surface of the frame bracket assumes a curve.

12. The display device as claimed in claim 8, wherein a wire-hidden slot is connected between the adjacent card slots, and the flexible towing component is arranged in the wire-hidden slot.

13. The display device as claimed in claim 8, wherein the fixed components are at least two first hanging components fixed on the frame bracket, and the flexible towing component is fixed on the first hanging component.

14. The display device as claimed in claim 13, wherein the curved display device further comprises a second hanging component arranged between the first hanging components, and the flexible towing component is hung on the second hanging component and able to move along the towing direction corresponding to the second hanging component.

15. The display device as claimed in claim 8, wherein the methods of the fixed component connecting with the flexible towing component include.

16. The display device as claimed in claim 8, wherein the flexible towing component is a flexible line.

* * * * *